United States Patent
Feng et al.

(10) Patent No.: US 11,437,575 B2
(45) Date of Patent: Sep. 6, 2022

(54) MANUFACTURING METHOD OF PEROVSKITE FILM HAVING HIGH TRANSMITTANCE, COMPOSITION FOR MANUFACTURING PEROVSKITE FILM, AND DISPLAY DEVICE HAVING TRANSPARENT DISPLAY

(71) Applicant: SHENZHEN CHINA STAR OPTOELECTRONICS SEMICONDUCTOR DISPLAY TECHNOLOGY CO., LTD., Shenzhen (CN)

(72) Inventors: Zhengyu Feng, Shenzhen (CN); Miao Duan, Shenzhen (CN)

(*) Notice: Subject to any disclaimer, the term of this patent is extended or adjusted under 35 U.S.C. 154(b) by 428 days.

(21) Appl. No.: 16/626,535

(22) PCT Filed: Dec. 20, 2019

(86) PCT No.: PCT/CN2019/126873
§ 371 (c)(1),
(2) Date: Dec. 25, 2019

(87) PCT Pub. No.: WO2021/088220
PCT Pub. Date: May 14, 2021

(65) Prior Publication Data
US 2021/0367150 A1 Nov. 25, 2021

(30) Foreign Application Priority Data
Nov. 7, 2019 (CN) .......................... 201911080652.X

(51) Int. Cl.
*B01D 3/34* (2006.01)
*H01L 51/00* (2006.01)
(Continued)

(52) U.S. Cl.
CPC .......... *H01L 51/0003* (2013.01); *C07B 63/04* (2013.01); *H01L 51/0032* (2013.01); *H01L 51/44* (2013.01); *H01L 51/5253* (2013.01)

(58) Field of Classification Search
CPC . H01L 51/0003; H01L 51/0032; H01L 51/44; H01L 51/5253; C07B 63/04
(Continued)

(56) References Cited

U.S. PATENT DOCUMENTS

| | | | |
|---|---|---|---|
| 9,570,240 B1 | 2/2017 | Durstock et al. | |
| 2009/0311605 A1* | 12/2009 | Visco | H01M 12/02 429/231.95 |

FOREIGN PATENT DOCUMENTS

| | | |
|---|---|---|
| CN | 105185908 A | 12/2015 |
| CN | 106410044 A | 2/2017 |

(Continued)

*Primary Examiner* — Phuc T Dang

(57) ABSTRACT

A manufacturing method of a perovskite film and a composition for preparing the perovskite film. The manufacturing method of the perovskite film comprises a step of manufacturing a first mixed solution, a step of manufacturing a second mixed solution, a low pressure distillation step, a coating step, and a drying step. The technical effect of the present disclosure is to provide the manufacturing method of the perovskite film and the composition for manufacturing the perovskite film, wherein the perovskite film comprises components of a metal halide and an organic halogen salt to adjust absorption wavelengths and emission wavelengths by modulating components and concentration of each component and makes the perovskite film have a higher transmittance in the visible light band. When ultraviolet light illuminates the perovskite film, the perovskite film can produce visible light due to photoluminescence effect of the perovskite material in the perovskite film, thereby achieving display effect.

15 Claims, 3 Drawing Sheets

(51) Int. Cl.
*H01L 51/44* (2006.01)
*H01L 51/52* (2006.01)
*C07B 63/04* (2006.01)

(58) Field of Classification Search
USPC .......................................................... 203/67
See application file for complete search history.

(56) References Cited

FOREIGN PATENT DOCUMENTS

| | | | |
|---|---|---|---|
| CN | 107180916 A | 9/2017 | |
| CN | 108232014 A | 6/2018 | |
| CN | 108251110 A | 7/2018 | |
| CN | 108319077 A | 7/2018 | |
| CN | 109306265 A | 2/2019 | |
| CN | 110305349 A | 10/2019 | |
| EP | 949289 A1 * | 10/1999 | ............. C08G 77/60 |
| EP | 1958979 A1 * | 8/2008 | ............. C08G 77/60 |

* cited by examiner

MANUFACTURING METHOD OF PEROVSKITE FILM HAVING HIGH TRANSMITTANCE, COMPOSITION FOR MANUFACTURING PEROVSKITE FILM, AND DISPLAY DEVICE HAVING TRANSPARENT DISPLAY

The present application claims the benefit of the Chinese Patent Application: CN201911080652.X filed on Nov. 7, 2019, and entitled "MANUFACTURING METHOD OF PEROVSKITE FILM AND COMPOSITION FOR MANUFACTURING PEROVSKITE FILM", which is incorporated herein by reference in its entirety.

FIELD OF INVENTION

The present disclosure relates to the field of display technologies, and more particularly, to a manufacturing method of a perovskite film and a composition for manufacturing the perovskite film, and a display device.

BACKGROUND OF INVENTION

Light-emitting devices comprise electroluminescence and photoluminescence. When driving an electroluminescence device to emit light, a driving current is applied to an electroluminescence layer by an anode and a cathode to make the electroluminescence layer emit light under the effect of the driving current. A photoluminescence device is dependent on an external light source to obtain energy, thereby exciting an illuminator to emit light.

In current technology, photoluminescence devices generally use quantum dots or phosphors to achieve illumination. However, quantum dots or phosphors excited by ultraviolet light to produce visible wavelengths has following disadvantages:

firstly, it is difficult to modulate illumination wavelengths. Quantum dots can achieve illumination wavelength conditions by changing particle sizes, and this technique requires precise control over the synthesis conditions. However, illumination wavelengths of phosphors are determined by intrinsic properties thereof, so it is more difficult to change illumination wavelengths of phosphors.

Secondly, manufacturing processes thereof are more complex, and raw materials thereof are expensive and have toxicity that will cause environment pollution. During the manufacturing processes, the thermal infusion method is needed to manufacture quantum dot light-emitting devices, and it needs to add materials such as cadmium, which have toxicity and easy to cause environment pollution.

Thirdly, transparency of light-emitting devices manufactured by using quantum dots or phosphors is limited. Since it is more difficult to modulate absorption spectrum of quantum dots and phosphors, light-emitting devices in current technology have lower transparency.

Technical problem: an objective of the present disclosure is to solve technical problems of having difficulty to control or change illumination wavelengths, complex manufacturing processes, environment pollution by raw materials, and lower transparency of light-emitting devices in current technology by providing a manufacturing method of a perovskite film, a composition for manufacturing the perovskite film, and a display device.

SUMMARY OF INVENTION

To achieve the above objective, an embodiment of the present disclosure provides a manufacturing method of a perovskite film. The method comprises following steps: a step of manufacturing a first mixed solution: adding a metal halide having molar concentration ranging from 0.01 to 1 mol/L and an organic halogen salt having molar concentration ranging from 0.01 to 1 mol/L to a solvent and mixing to obtain the first mixed solution; a step of manufacturing a second mixed solution: adding a stabilizer having molar concentration ranging from 0.01 to 1 mol/L to the first mixed solution to form the second mixed solution; a low pressure distillation step: distilling the second mixed solution at a low pressure to obtain a precursor solution; a coating step: coating the precursor solution to an upper surface of a substrate, wherein the precursor solution forms a perovskite layer having organic-inorganic hybrid perovskite particles; and a drying step: heating the substrate, wherein the perovskite layer is dried to form a perovskite film.

Further, after the drying step, the method further comprises an encapsulation step: encapsulating the perovskite film.

Further, in the first mixed solution or the second mixed solution, a molar ratio of the metal halide to the organic halogen salt ranges from 0.8 to 1.2.

Further, the metal halide comprises a divalent metal ion; the organic halogen salt comprises a RNH3 group or a NH2CH=NH2 group, wherein R is an alkyl group.

Further, the solvent comprises at least one of dimethylformamide, dimethyl sulfoxide, or γ-butyrolactone; the stabilizer comprises a carboxylic acid and/or an amine.

Further, wherein in the low pressure distillation step, the distillation is performed under a pressure ranging from 10 Pa to 1000 Pa.

Further, wherein in the coating step, the precursor solution undergoes an in situ reaction on a surface of the substrate and forms the perovskite layer.

Further, wherein in the coating step, the organic-inorganic hybrid perovskite particles are distributed uniformly on the upper surface of the substrate.

To achieve the above objective, an embodiment of the present disclosure further provides a composition for manufacturing the perovskite film which comprises a solvent, a metal halide, an organic halogen salt, and a stabilizer. The metal halide is dissolved in the solvent and has molar concentration ranging from 0.01 to 1 mol/L. The organic halogen salt is dissolved in the solvent and has molar concentration ranging from 0.01 to 1 mol/L. The stabilizer is dissolved in the solvent and has molar concentration ranging from 0.01 to 1 mol/L.

To achieve the above objective, an embodiment of the present disclosure further provides a display device which comprises the above perovskite film. Wherein the perovskite film is used to absorb ultraviolet light emitted from a projector and emit visible light.

Further, the projector is used to output a plurality of parts of an image at a same time.

Further, the perovskite film absorbs an ultraviolet spectrum and emits a green light spectrum.

Further, the perovskite film is transparent under natural light.

Further, the display device further comprises:

a substrate, wherein the perovskite film is disposed on an upper surface of the substrate; and an encapsulation layer disposed on an upper surface of the perovskite film.

Beneficial effect: the technical effect of the present disclosure is to provide a manufacturing method of a perovskite film and a composition for manufacturing the perovskite film. The perovskite film comprises components of a metal halide and an organic halogen salt. The present disclosure reduces wavelength absorption of perovskite material in the visible light band by adjusting components and concentration of each component to make it have a higher transmittance in the visible light band, and makes material in the perovskite film to emit light by illuminating the perovskite film with ultraviolet light to achieve effect of transparent display.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION OF PREFERRED EMBODIMENTS

The preferred embodiments of the present disclosure are described in detail below with reference to the accompanying drawings. The specific embodiments described with reference to the attached drawings are all exemplary and are intended to illustrate and interpret the present disclosure to make the skilled in the art easier to understand how to implement the present disclosure. The disclosure herein provides many different embodiments or examples for realizing different structures of the present disclosure. They are only examples and are not intended to limit the present disclosure.

An embodiment of the present disclosure provides a manufacturing method of a perovskite film for applying in the field of display technologies to achieve effect of transparent display. The perovskite film has components of a metal halide having molar concentration ranging from 0.01 to 1 mol/L, an organic halogen salt having molar concentration ranging from 0.01 to 1 mol/L, and a stabilizer having molar concentration ranging from 0.01 to 1 mol/L, preferably, a molar ratio of the metal halide to the organic halogen salt ranges from 0.8 to 1.2, thereby adjusting absorption wavelengths and emission wavelengths in the perovskite film and making the perovskite film have better transparent effect in the full visible light band.

Wherein, the metal halide is a divalent metal halide $BX_2$, wherein B is a divalent metal ion, and X is a halogen. Preferably, the metal halide is $PbX_2$, $SnX_2$, or $ZnX_2$. The organic halogen salt is AX, wherein A is an organic cation comprising an $RNH_3$ group or a $NH_2CH_2=NH_2$ group, R is an alkyl group, and X is a halogen. The halogen in the metal halide $BX_2$ and the organic halogen salt AX can be the same or not. The solvent comprises at least one of dimethylformamide (DMF), dimethyl sulfoxide (DMSO), or γ-butyrolactone (GBL). The stabilizer comprises a carboxylic acid and/or an amine.

Figure 1:
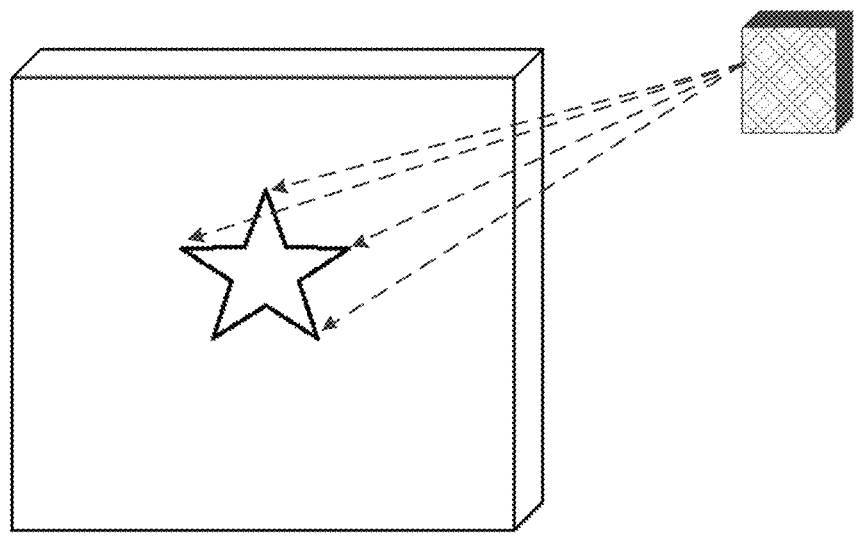
FIG. 1 is a schematic diagram of an transparent display of the perovskite film according to an embodiment of the present disclosure.

As shown in FIG. 1, when visible light illuminates the perovskite film, the perovskite film presents a transparent state due to having a higher transmittance in the visible light band. When ultraviolet light illuminates a surface of the perovskite film through a specific pattern, a specific area on the surface of the perovskite film is excited by the light to show the pattern, and other areas maintain the transparent state to achieve the objective of transparent display.

Figure 2:
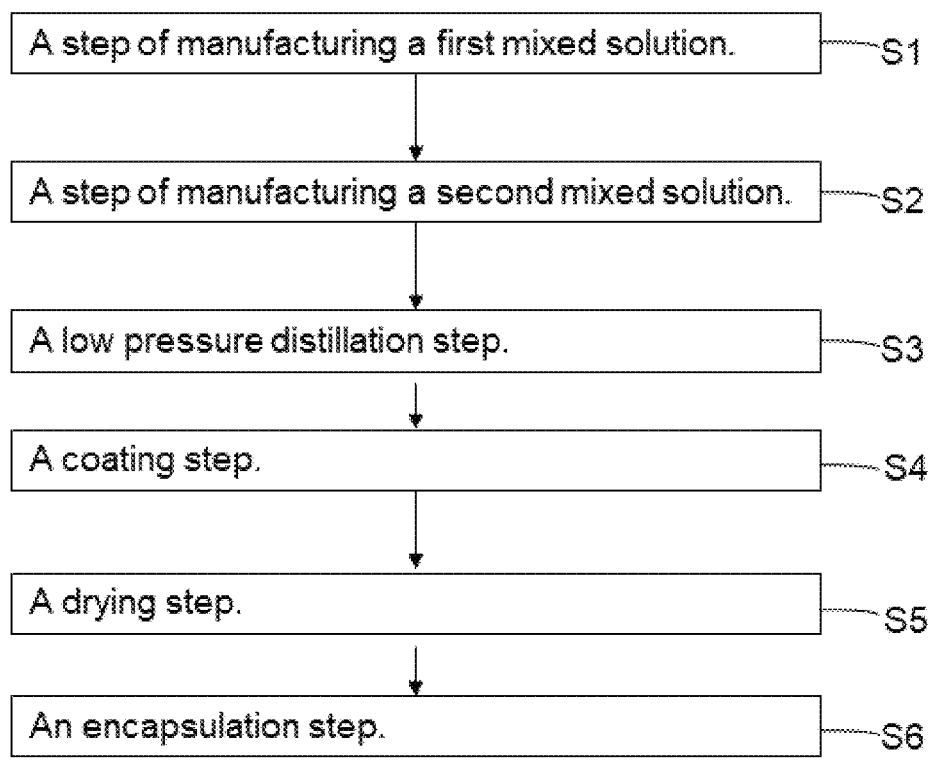
FIG. 2 is a flowchart of the manufacturing method of the perovskite film according to an embodiment of the present disclosure.

As shown in FIG. 2, the embodiment provides a manufacturing method of the perovskite film. The method comprises following steps S1 to S5.

S1: a step of manufacturing a first mixed solution: adding 1 mmol of a metal halide $BX_2$ and 1 mmol of an organic halogen salt AX to 10 ml of a solvent, and mixing for 30 minutes with a stirrer to obtain the uniform first mixed solution $ABX_3$.

S2: a step of manufacturing a second mixed solution: adding 1 mmol of a stabilizer to the first mixed solution $ABX_3$ to form the second mixed solution. The stabilizer is mainly used in surface modification of the first mixed solution $ABX_3$ to prevent aggregation and deposition, thereby improving stability of the first mixed solution $ABX_3$. Preferably, the stabilizer is ethanolamine or ethane dioic acid.

S3: a low pressure distillation step: distilling the second mixed solution under a low pressure ranging from 10 Pa to 1000 Pa to obtain a precursor solution.

S4: a coating step: coating the precursor solution to an upper surface of a substrate, wherein the precursor solution forms a perovskite layer having organic-inorganic hybrid perovskite particles. Specifically, the precursor solution is coated on the upper surface of the substrate by spin coating or blade coating to make the precursor solution uniformly attached to the upper surface of the substrate. The precursor solution undergoes an in situ reaction on a surface of the substrate and forms the perovskite layer. The perovskite layer comprises organic-inorganic hybrid perovskite particles, and the organic-inorganic hybrid perovskite particles are uniformly distributed on the upper surface of the substrate. In the embodiment, the substrate may be an ordinary glass substrate, a polyimide (PI) substrate, or a flexible organic substrate like PET.

S5: a drying step: heating the substrate, wherein the perovskite layer is dried to form a perovskite film. Specifically, the perovskite layer is dried for 5 to 20 minutes at a temperature ranging from 58° C. to 110° C. to form the perovskite film.

S6: an encapsulation step: encapsulating the perovskite film. Specifically, an encapsulation layer is manufactured on the upper surface of the perovskite film. A material of the encapsulation layer is a UV curing adhesive based on acrylic resins that could protect the perovskite film from contact with the air, thereby achieving effect of water and oxygen isolation and improving stability of the perovskite film.

The embodiment of the present disclosure provides a manufacturing method of a perovskite film and a composition for manufacturing the perovskite film. The perovskite film comprises components of a metal halide and an organic halogen salt. The present disclosure reduces wavelength absorption of perovskite material in the visible light band by adjusting components and concentration of each component to make it have a higher transmittance in the visible light band, and makes material in the perovskite film to emit light by illuminating the perovskite film with ultraviolet light to achieve effect of transparent display. Compared to current photoluminescence materials, such as quantum dots, this method has advantages of higher transparency, simple manufacturing processes, and low environment pollution by raw materials.

Figure 3:
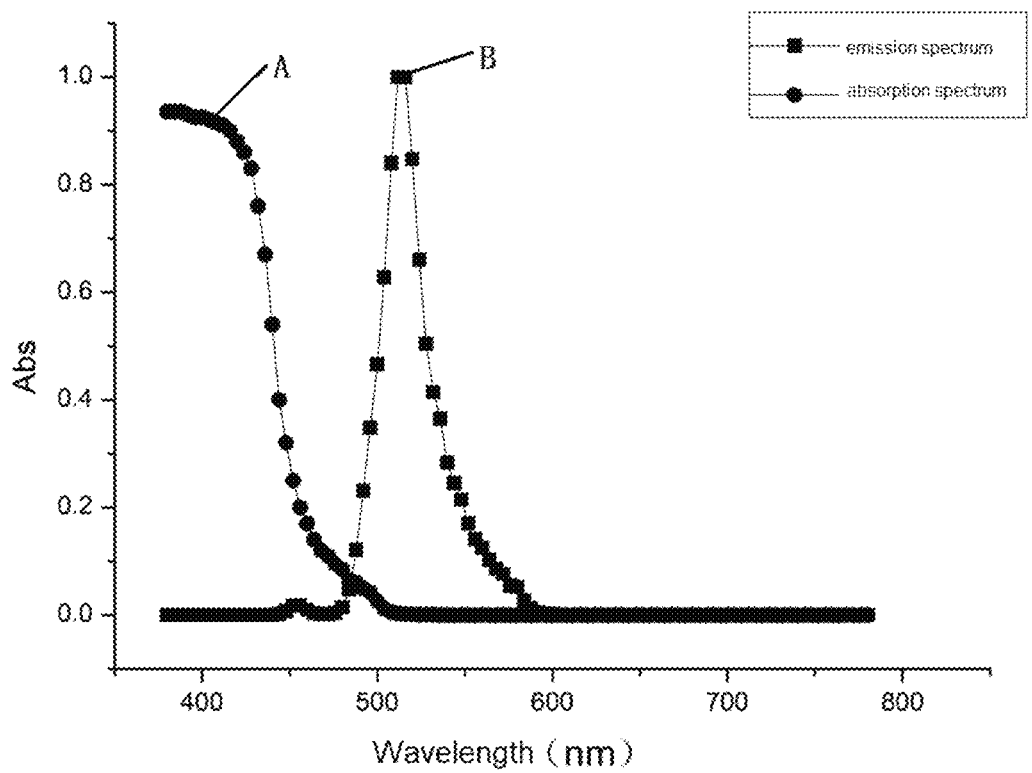
FIG. 3 is an absorption and emission spectrum diagram of the perovskite film according to an embodiment of the present disclosure.

As shown in FIG. 3, A is an absorption spectrum curve of the perovskite material in the perovskite film, and B is an emission spectrum curve of the perovskite material in the perovskite film. During processes of manufacturing the perovskite film, the perovskite film has higher absorption in the ultraviolet light band and lower absorption in the visible light band. Therefore, higher transparency can be achieved by adjusting material components to concentrate absorption peaks in the ultraviolet light band with lower absorption in the visible light band. Meanwhile, emission peaks are concentrated in the visible light band. Visible light can be emitted by excitation of the ultraviolet light, and a better transparent effect can be obtained, thereby achieving transparent display. Specifically, components of the perovskite film comprise the metal halide $BX_2$ and the organic halogen salt AX. The perovskite film has a structural formula of $ABX_3$, wherein A is an organic cation, B is a divalent metal ion, and X is a halogen. Therefore, the absorption wavelengths and emission wavelengths can be adjusted by modulating elemental components of $ABX_3$ and concentration thereof, thereby obtaining a better transparent effect in the full visible light band. Specifically, the perovskite film can be excited to produce visible light in the ultraviolet light band by adjusting absorption wavelengths, thereby having better transparency, and a specific color of light can be obtained by adjusting emission wavelengths.

The embodiment of the present disclosure provides a manufacturing method of a perovskite film. The perovskite film comprises components of a metal halide $BX_2$ and an organic halogen salt AX. The present disclosure adjusts absorption wavelengths and emission wavelengths by modulating components and concentration of each component. When ultraviolet light illuminates the perovskite film, the perovskite film can produce visible light due to photoluminescence effect of the perovskite material in the perovskite film, thereby achieving display effect.

Compared to current technology, current technology uses quantum dots or fluorescent materials to manufacture a light-emitting layer. The material in the light-emitting layer can be excited to produce visible light by illumination of ultraviolet light, thereby achieving effect of transparent display, but absorption wavelengths and emission wavelengths cannot be adjusted. The perovskite film provided by the embodiment is equivalent to the light-emitting layer of current technology. Using the perovskite film can achieve effect of transparent display, and absorption wavelengths and emission wavelengths can be adjusted. In addition, the manufacturing process of the perovskite film is simple and cost thereof is lower.

An embodiment of the present disclosure provides a perovskite film manufactured by the above manufacturing method. The perovskite film has advantages of low cost, high color purity, and wide color gamut as a photoelectric material, and plays an important role in display devices. Components of the perovskite film comprise the metal halide $BX_2$ and the organic halogen salt AX. The perovskite film has a structural formula of $ABX_3$, wherein A is an organic cation, B is a divalent metal ion, and X is a halogen. Therefore, the absorption wavelengths and emission wavelengths can be adjusted by modulating elemental components of $ABX_3$ and concentration thereof, thereby the perovskite film has a better transparent effect in the full visible light band. Specifically, the perovskite film can be excited to produce visible light in the ultraviolet light band by adjusting absorption wavelengths, thereby having better transparency, and a specific color of light can be obtained by adjusting emission wavelengths.

Under an ordinary environment, when visible light illuminates the perovskite film, the perovskite film presents a transparent state due to having a higher transmittance in the visible light band. When ultraviolet light illuminates a surface of the perovskite film through a specific pattern, a specific area on the surface of the perovskite film is excited by light to show the pattern, and other areas maintain the transparent state to achieve the objective of transparent display.

The above perovskite film is applied in photoluminescence devices. When ultraviolet light illuminates the perovskite film, the perovskite film can produce visible light due to photoluminescence effect of the perovskite material in the perovskite film, thereby achieving display effect and improving the performance of photoluminescence devices.

An embodiment of the present disclosure provides a composition for manufacturing the perovskite film. The composition comprises a solvent, a metal halide, an organic halogen salt, and a stabilizer. Wherein, the metal halide is dissolved in the solvent and has molar concentration ranging from 0.01 to 1 mol/L, the organic halogen salt is dissolved in the solvent and has molar concentration ranging from 0.01 to 1 mol/L, and the stabilizer is dissolved in the solvent and has molar concentration ranging from 0.01 to 1 mol/L, preferably, a molar ratio of the metal halide to the organic halogen salt ranges from 0.8 to 1.2, thereby adjusting absorption wavelengths and emission wavelengths in the perovskite film and making the perovskite film have better transparent effect in the full visible light band.

Wherein, the metal halide is a divalent metal halide $BX_2$, wherein B is a divalent metal ion, and X is a halogen. Preferably, the metal halide is $PbX_2$, $SnX_2$, or $ZnX_2$. The organic halogen salt is AX, wherein A is an organic cation comprising an $RNH_3$ group or a $NH_2CH_2$=$NH_2$ group, R is an alkyl group, and X is a halogen. The halogen in the metal halide $BX_2$ and the organic halogen salt AX can be the same or not. The solvent comprises at least one of dimethylformamide (DMF), dimethyl sulfoxide (DMSO), or γ-butyrolactone (GBL), the stabilizer comprises a carboxylic acid and/or an amine.

The perovskite film of the embodiment is manufactured by a solvent, a metal halide, an organic halogen salt, and a stabilizer. The perovskite film has advantages of low cost, high color purity, and wide color gamut as a photoelectric material, and plays an important role in display devices. Components of the perovskite film comprise the metal halide $BX_2$ and the organic halogen salt AX. The perovskite film has a structural formula of $ABX_3$, wherein A is an organic cation, B is a divalent metal ion, and X is a halogen. Therefore, the absorption wavelengths and emission wavelengths can be adjusted by modulating elemental components of $ABX_3$ and concentration thereof, thereby the perovskite film has a better transparent effect in the full visible light band. Specifically, the perovskite film can be excited to produce visible light in the ultraviolet light band by adjusting absorption wavelengths, thereby having better transparency, and a specific color of light can be obtained by adjusting emission wavelengths.

Under an ordinary environment, when visible light illuminates the perovskite film, the perovskite film presents a transparent state due to having a higher transmittance in the visible light band. When ultraviolet light illuminates a surface of the perovskite film through a specific pattern, a specific area on the surface of the perovskite film is excited by light to show the pattern, and other areas maintain the transparent state to achieve the objective of transparent display.

Figure 4:
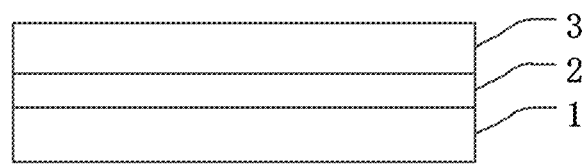
FIG. 4 is a schematic structural diagram of a display device according to an embodiment of the present disclosure.

As shown in FIG. 4, an embodiment of the present disclosure further provides a display device which comprises a substrate 1, the above perovskite film 2, and an encapsulation layer 3.

Wherein, the perovskite film 2 is disposed on an upper surface of the substrate 1, and the encapsulation layer 3 is disposed on an upper surface of the perovskite film 2. The substrate 1 is transparent or basically transparent. The perovskite film 2 is transparent under natural light, and is used to absorb ultraviolet light emitted from a projector and then emit visible light. The perovskite film 2 absorbs an ultraviolet spectrum and emits a green light spectrum, and adjustment from green light to red light can be achieved by adjusting the composition of the perovskite film. The projector is used to output a plurality of parts of an image at a same time. The projector is a projector having digital micromirror devices.

The display device further comprises digital micromirror devices. When working, the projector is connected to a computer. When ultraviolet light illuminates the display device, a pattern can be generated in the projector by control of the computer. In the process of forming the pattern, visible light illuminates the perovskite film through the display device, and the perovskite film presents a transparent state due to having a higher transmittance in the visible light band. When ultraviolet light illuminates a surface of the perovskite film through a specific pattern, a specific area on the surface of the perovskite film is excited by the light to show the pattern, and other areas maintain the transparent state to achieve the objective of transparent display.

In brief, the display device is illuminated with ultraviolet light, and visible light is excited in a specific region on the perovskite film, so that the display device has a transparent display effect. In the embodiment of the present disclosure, the luminous intensity and transparency of the display device can be controlled by adjusting a thickness of the perovskite thin film and concentration of materials thereof.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A manufacturing method of a perovskite film, comprising following steps:
a step of manufacturing a first mixed solution: adding a metal halide having molar concentration ranging from 0.01 to 1 mol/L and an organic halogen salt having molar concentration ranging from 0.01 to 1 mol/L to a solvent and mixing to obtain the first mixed solution;
a step of manufacturing a second mixed solution: adding a stabilizer having molar concentration ranging from 0.01 to 1 mol/L to the first mixed solution to form the second mixed solution;
a low pressure distillation step: distilling the second mixed solution at a low pressure to obtain a precursor solution;
a coating step: coating the precursor solution to an upper surface of a substrate, wherein the precursor solution forms a perovskite layer having organic-inorganic hybrid perovskite particles; and
a drying step: heating the substrate, wherein the perovskite layer is dried to form a perovskite film.

2. The manufacturing method of the perovskite film according to claim 1,
wherein after the drying step, comprising
an encapsulation step: encapsulating the perovskite film.

3. The manufacturing method of the perovskite film according to claim 1,
wherein in the first mixed solution or the second mixed solution,
a molar ratio of the metal halide to the organic halogen salt ranges from 0.8 to 1.2.

4. The manufacturing method of the perovskite film according to claim 1,
wherein the metal halide comprises a divalent metal ion;
the organic halogen salt comprises a $RNH_3$ group or a $NH_2CH_2=NH_2$ group, wherein R is an alkyl group.

5. The manufacturing method of the perovskite film according to claim 1,
the solvent comprises at least one of dimethylformamide, dimethyl sulfoxide, or γ-butyrolactone;
the stabilizer comprises a carboxylic acid and/or an amine.

6. The manufacturing method of the perovskite film according to claim 1,
wherein in the low pressure distillation step, the distillation is performed under a pressure ranging from 10 Pa to 1000 Pa.

7. The manufacturing method of the perovskite film according to claim 1,
wherein in the coating step, the precursor solution undergoes an in situ reaction on a surface of the substrate and forms the perovskite layer.

8. The manufacturing method of the perovskite film according to claim 1,
wherein in the coating step, the organic-inorganic hybrid perovskite particles are distributed uniformly on the upper surface of the substrate.

9. The manufacturing method of the perovskite film according to claim 1,
wherein in the coating step, the precursor solution is coated on the upper surface of the substrate by spin coating or blade coating.

10. A composition for manufacturing a perovskite film, comprising:
a solvent;
a metal halide dissolved in the solvent and having molar concentration ranging from 0.01 to 1 mol/L;
an organic halogen salt dissolved in the solvent and having molar concentration ranging from 0.01 to 1 mol/L;
a stabilizer dissolved in the solvent and having molar concentration ranging from 0.01 to 1 mol/L.

11. A display device, comprising a perovskite film prepared from the composition according to claim 10, wherein the perovskite film is used to absorb ultraviolet light emitted from a projector and emit visible light.

12. The display device according to claim 11, wherein the projector is used to output a plurality of parts of an image at a same time.

13. The display device according to claim 11, wherein the perovskite film absorbs an ultraviolet spectrum and emits a green light spectrum.

14. The display device according to claim 11, wherein the perovskite film is transparent under natural light.

15. The display device according to claim 11, further comprising:
   a substrate, wherein the perovskite film is disposed on an upper surface of the substrate; and
   an encapsulation layer disposed on an upper surface of the perovskite film.

* * * * *